US009723729B2

(12) United States Patent
Furusawa et al.

(10) Patent No.: US 9,723,729 B2
(45) Date of Patent: Aug. 1, 2017

(54) PRINTED WIRING BOARD

(71) Applicant: IBIDEN CO., LTD., Ogaki-shi (JP)

(72) Inventors: Takeshi Furusawa, Ogaki (JP); Kota Noda, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 0 days.

(21) Appl. No.: 14/920,974

(22) Filed: Oct. 23, 2015

(65) Prior Publication Data
US 2016/0120033 A1 Apr. 28, 2016

(30) Foreign Application Priority Data

Oct. 23, 2014 (JP) .................................. 2014-216387

(51) Int. Cl.
*H05K 1/11* (2006.01)
*H05K 1/02* (2006.01)
(Continued)

(52) U.S. Cl.
CPC ......... *H05K 3/4697* (2013.01); *H01L 21/486* (2013.01); *H01L 23/13* (2013.01);
(Continued)

(58) Field of Classification Search
CPC ........... H05K 3/4697; H05K 2203/107; H05K 3/0097; H05K 3/4602; H05K 2201/10674; H05K 1/021; H05K 1/0212; H05K 1/0215; H05K 1/023; H05K 1/0231; H05K 1/0233; H05K 1/0234; H05K 1/0243; H05K 1/0295; H05K 1/14; H05K 1/141; H05K 1/142; H05K 1/144; H05K 1/145; H05K 1/16; H05K 1/162; H05K 1/165; H05K 1/181; H05K 1/182; H05K 1/183; H05K 1/184;
(Continued)

(56) References Cited

U.S. PATENT DOCUMENTS 6,809,415 B2 * 10/2004 Tsukada ............... H05K 3/3452
174/257
9,305,853 B2 * 4/2016 Hsu ....................... H01L 25/105
(Continued)

FOREIGN PATENT DOCUMENTS

JP 2007-123524 A 5/2007

*Primary Examiner* — Ishwarbhai B Patel
(74) *Attorney, Agent, or Firm* — Oblon, McClelland, Maier & Neustadt, L.L.P.

(57) ABSTRACT

A printed wiring board includes a substrate, a first conductor layer formed on first surface of the substrate, a second conductor layer formed on second surface of the substrate, a through-hole conductor penetrating through the substrate and connecting the first and second conductor layers, a build-up layer formed on the second surface of the substrate and including conductor layers, insulating layers and via conductors, and a first insulating layer formed on the first surface the substrate and covering the first conductor layer. The substrate has a cavity penetrating through the first insulating layer and substrate and exposing the build-up layer on the substrate, the via conductors include a lowermost via conductor having a bottom portion exposed at bottom of the cavity, and the bottom portion of the lowermost via conductor is recessed relative to surface of a lowermost insulating layer in the build-up layer at the bottom of the cavity.

20 Claims, 8 Drawing Sheets

(51) Int. Cl.
  *H05K 1/09* (2006.01)
  *H05K 3/46* (2006.01)
  *H01L 23/13* (2006.01)
  *H05K 1/18* (2006.01)
  *H05K 3/00* (2006.01)
  *H01L 23/498* (2006.01)
  *H01L 21/48* (2006.01)

(52) U.S. Cl.
  CPC .. *H01L 23/49827* (2013.01); *H01L 23/49838* (2013.01); *H05K 1/0298* (2013.01); *H05K 1/09* (2013.01); *H05K 1/115* (2013.01); *H01L 21/4857* (2013.01); *H01L 23/49822* (2013.01); *H01L 2224/16227* (2013.01); *H01L 2224/16235* (2013.01); *H01L 2225/1023* (2013.01); *H01L 2225/1058* (2013.01); *H01L 2924/15311* (2013.01); *H05K 1/18* (2013.01); *H05K 1/183* (2013.01); *H05K 3/0097* (2013.01); *H05K 3/4602* (2013.01); *H05K 2201/10674* (2013.01); *H05K 2203/107* (2013.01)

(58) Field of Classification Search
  CPC ........... H05K 1/185; H05K 2201/0317; H05K 2201/041; H05K 2201/049; H05K 2201/09763; H05K 2201/09872; H05K 2201/10446; H05K 2201/10454; H05K 2201/10462; H05K 2201/10469; H05K 2201/10484; H05K 2201/10492; H05K 2201/105; H05K 3/30; H05K 3/32; H05K 3/341; H05K 3/3415; H05K 3/3421; H05K 3/3431; H05K 3/36; H05K 3/46; H01L 23/49838; H01L 23/49827; H01L 21/486; H01L 23/13; H01L 21/4857; H01L 23/49822
  See application file for complete search history.

(56) References Cited

U.S. PATENT DOCUMENTS

2010/0308451 A1* 12/2010 Kodani .................... H05K 1/09
  257/690
2013/0192879 A1* 8/2013 Morita ................. H05K 3/4655
  174/251
2013/0284506 A1* 10/2013 Zanma ................... H05K 1/115
  174/260

* cited by examiner

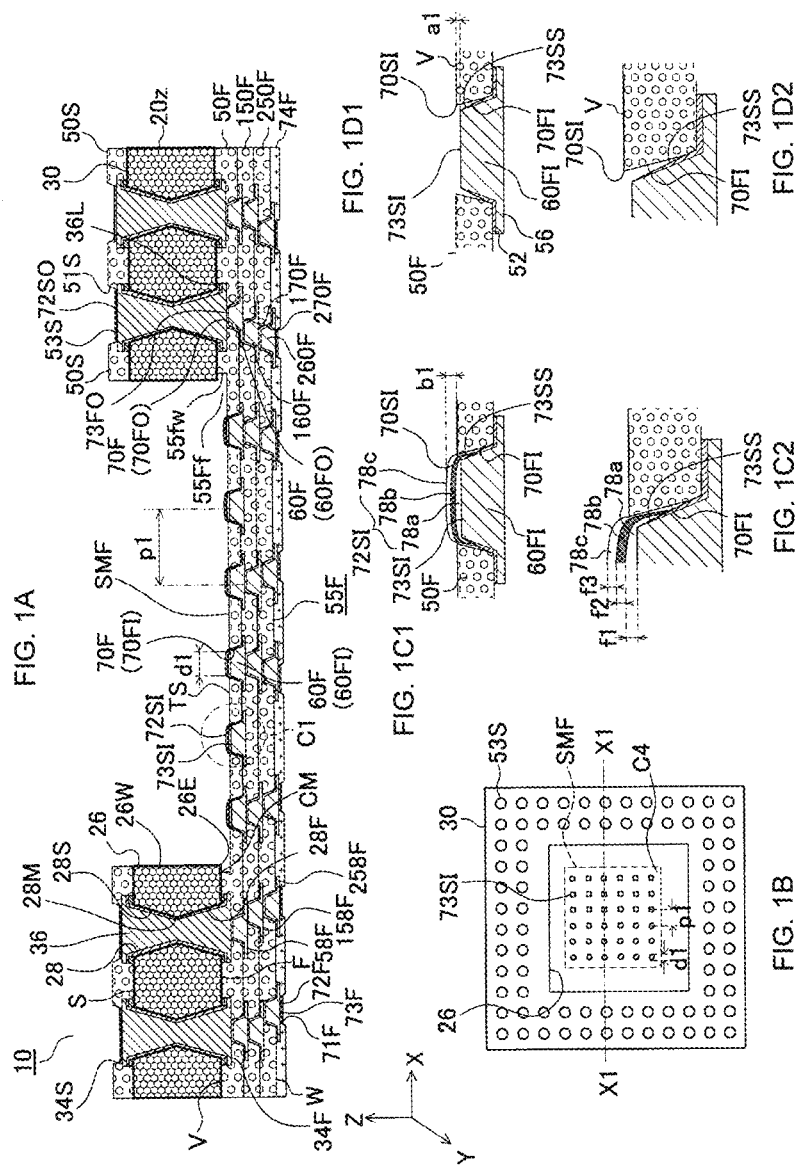

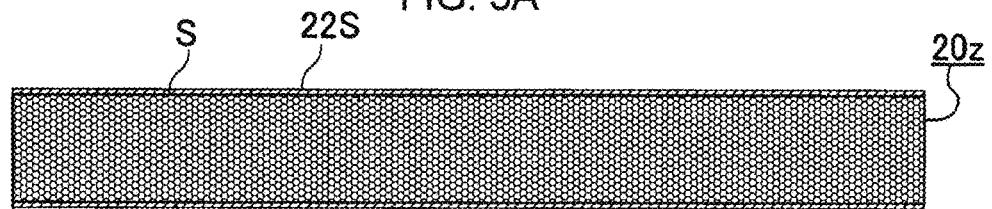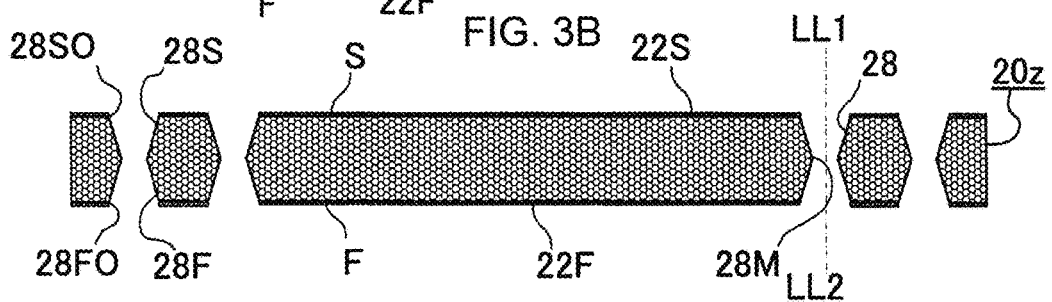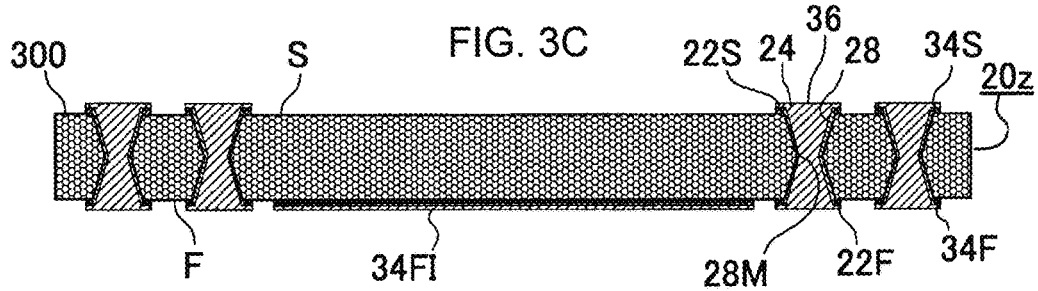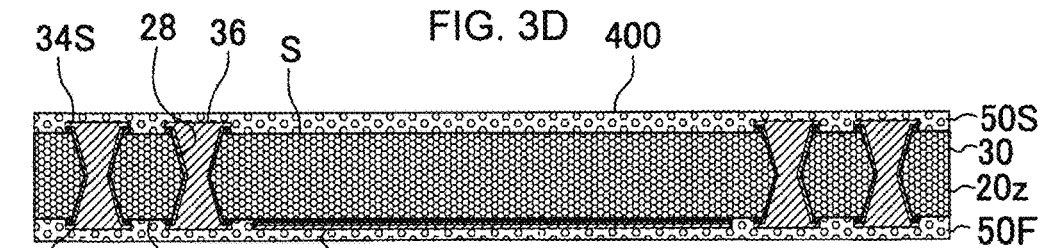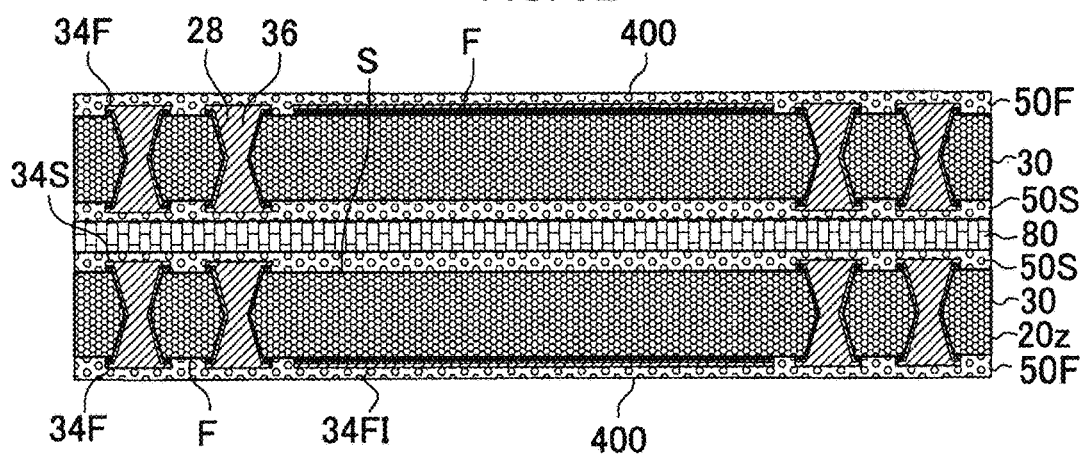

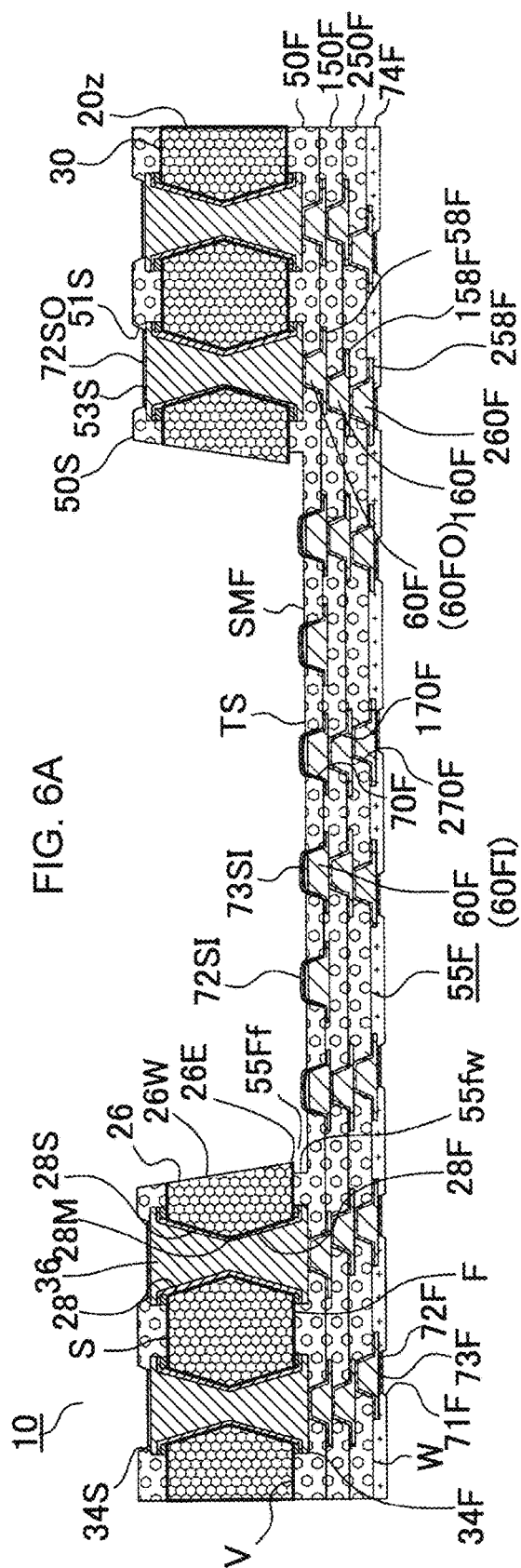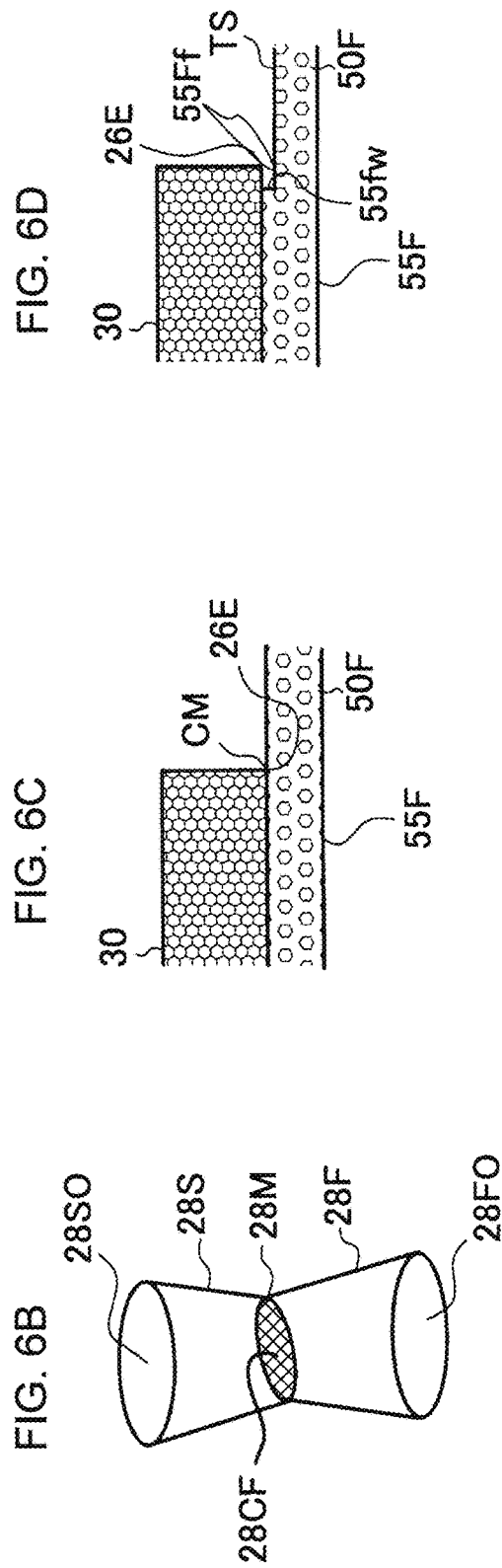

US 9,723,729 B2

PRINTED WIRING BOARD

CROSS-REFERENCE TO RELATED APPLICATIONS

The present application is based upon and claims the benefit of priority to Japanese Patent Application No. 2014-216387, filed Oct. 23, 2014, the entire contents of which are incorporated herein by reference.

BACKGROUND OF THE INVENTION

Field of the Invention

The present invention relates to a printed wiring board having a cavity for exposing a mounting area.

Description of Background Art

Japanese Patent Laid-Open Publication No. 2007-123524 describes a substrate with a built-in electronic component, which includes a coreless substrate and a resin layer. An accommodating part (for accommodating a semiconductor chip) and a through via are formed in the resin layer. The entire contents of this publication are incorporated herein by reference.

SUMMARY OF THE INVENTION

According to one aspect of the present invention, a printed wiring board includes a substrate, a first conductor layer formed on a first surface of the substrate, a second conductor layer formed on a second surface of the substrate, a through-hole conductor penetrating through the substrate such that the through-hole conductor is connecting the first conductor layer and the second conductor layer, a build-up layer formed on the second surface of the substrate and including conductor layers, insulating layers, and via conductors connecting the conductor layers through the insulating layers, and a first insulating layer formed on the first surface the substrate such that the first insulating layer is covering the first conductor layer on the substrate. The substrate has a cavity penetrating through the first insulating layer and the substrate such that the cavity is exposing the build-up layer on the second surface of the substrate, the via conductors include a lowermost via conductor having a bottom portion exposed at a bottom of the cavity, and the lowermost via conductor is formed such that the bottom portion of the lowermost via conductor is recessed relative to a surface of a lowermost insulating layer in the build-up layer at the bottom of the cavity.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1A is a cross-sectional view of a printed wiring board according to an embodiment of the present invention;

FIG. 1B is a plan view illustrating a first circuit substrate and a mounting area that is exposed from an opening of the first circuit substrate;

FIGS. 1C1, 1C2, 1D1 and 1D2 are cross-sectional views of mounting via conductors;

FIG. 3A-3E are process diagrams illustrating a method for manufacturing the printed wiring board of the embodiment;

FIG. 6A illustrates a cross-sectional view of a printed wiring board of a first modified example of the embodiment;

FIG. 6B illustrates a schematic diagram of a through hole;

FIG. 6C illustrates a contact point;

FIG. 6D illustrates a recess;

DETAILED DESCRIPTION OF THE EMBODIMENTS

Figure 2A:
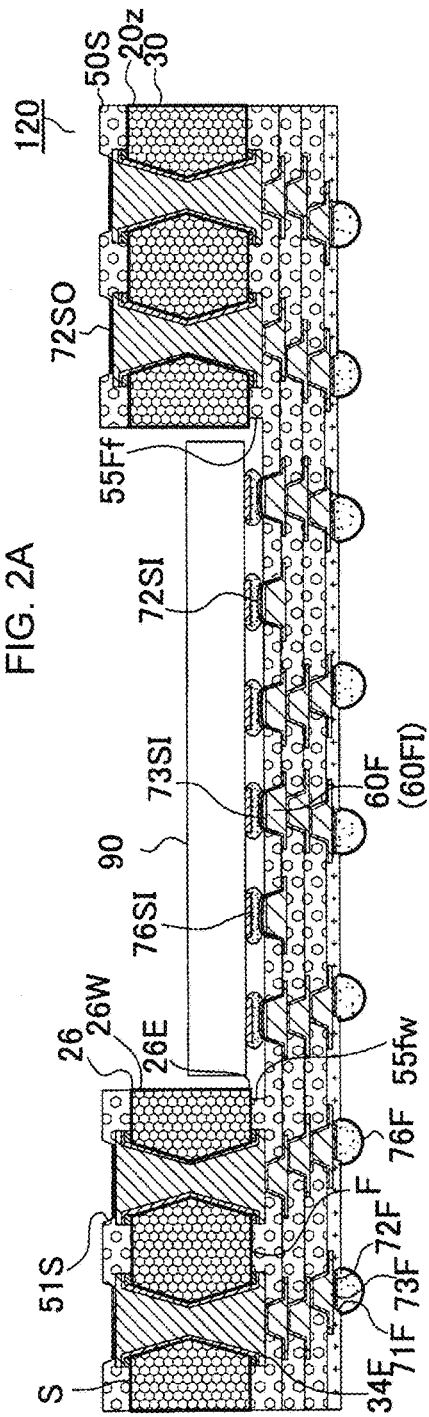
FIGS. 2A and 2B are cross-sectional views of application examples of the printed wiring board according to the embodiment.

The embodiments will now be described with reference to the accompanying drawings, wherein like reference numerals designate corresponding or identical elements throughout the various drawings.

FIG. 1A illustrates a printed wiring board 10 of an embodiment. The printed wiring board 10 of the present embodiment includes a first circuit substrate 30 that has a first surface (S) and a second surface (F) that is on an opposite side of the first surface, and a second circuit substrate (55F) that has a third surface (V) and a fourth surface (W) that is on an opposite side of the third surface.

The second circuit substrate (55F) illustrated in FIG. 1A is formed as a build-up layer that is formed by conductor layers (58F, 158F, 258F) and resin insulating layers (50F, 150F, 250F) that are alternately laminated. The second circuit substrate (55F) is laminated on the second surface (F) of the first circuit substrate 30. The third surface (V) of the second circuit substrate and the second surface (F) of the first circuit substrate oppose each other. The third surface (V) of the second circuit substrate and the second surface (F) of the first circuit substrate are in contact with each other.

The resin insulating layers of the second circuit substrate are formed of resin and inorganic particles. Further, the resin insulating layers (50F, 150F, 250F) may each contain a reinforcing member such as a glass cloth. By allowing the resin insulating layers (50F, 150F, 250F) to each contain a reinforcing member, occurrence of a crack in the second circuit substrate is suppressed.

The resin insulating layers each have openings for via conductors, and the openings each taper from the fourth surface (W) side toward the third surface (V) side.

Via conductors (60F, 160F, 260F) are formed in the openings of the resin insulating layers. The via conductors each have a side wall that tapers from the fourth surface (W)

side toward the third surface (V) side. Conductor layers that are adjacent to each other are connected by the via conductors.

The second circuit substrate (55F) has a mounting area (SMF) illustrated in FIG. 1B at a substantially central portion of the third surface (V). An X1-X1 cross section in FIG. 1B corresponds to FIG. 1A. The mounting area is exposed by an opening (cavity) 26 of the first circuit substrate. An electronic component such as an IC chip is mounted in the mounting area.

The first circuit substrate illustrated in FIG. 1A is formed by an insulating substrate (20z) that contains resin and a reinforcing member, a first conductor layer (34S), a second conductor layer (34F), and through-hole conductors 36. The insulating substrate has a first surface (S) and a second surface (F) that is on an opposite side of the first surface (S). The first surface of the insulating substrate and the first surface of the first circuit substrate are the same surface. The second surface of the insulating substrate and the second surface of the first circuit substrate are the same surface. The insulating substrate may further contain inorganic particles. The first conductor layer (34S) is formed on the first surface, and the second conductor layer (34F) is formed on the second surface. The first conductor layer and the second conductor layer are connected by the through-hole conductors. The first circuit substrate further has the opening 26 for exposing the mounting area (SMF) of the second circuit substrate. In FIG. 1A, the printed wiring board does not have a conductor layer on the first conductor layer. In this case, the first conductor layer is an uppermost conductor layer.

As illustrated in FIG. 1A, the first resin insulating layer (50F) is formed on the second surface (F) and the second conductor layer (34F) of the first circuit substrate 30. Openings (70F) (70FI, 70FO) for via conductors (60F) (60FI, 60FO) that penetrate the resin insulating layer (50F) are formed in the first resin insulating layer (50F).

The conductor layer (58F) in the second circuit substrate is formed on the first resin insulating layer (50F).

The via conductors (60F) are formed in the openings (70F) for the via conductors (60F). The via conductors (60F) include connection via conductors (60FO) that connect the conductor layer (conductor layer in the second circuit substrate) (58F) and the second conductor layer (34F) and mounting via conductors (60FI) for mounting an electronic component. It is preferable that the connection via conductors (60FO) be directly connected to lands (36L) of the through-hole conductors in the first circuit substrate. A land (36L) is formed by a conductor covering a through-hole conductor and a conductor that surrounds the through-hole conductor, and is contained in the second conductor layer (34F).

The mounting via conductors are formed in the mounting area (SMF). The mounting via conductors (60FI) are formed in the openings (70FI) for the via conductors of the first resin insulating layer (50F). Bottoms (C4 pads) (73SI) of the mounting via conductors (60FI) are exposed by the openings (70FI). Further, the bottoms (73SI) are exposed by the opening 26 of the first circuit substrate. The bottoms (C4 pads) of the mounting via conductors are exposed by the opening 26 and the openings (70FI).

The connection via conductors (60FO) are respectively formed in the openings (70FO) of the first resin insulating layer (50F). Bottoms (73FO) of the connection via conductors (60FO) are respectively directly connected to the lands (36L) of the through-hole conductors.

As illustrated in FIG. 1A, the bottoms of the mounting via conductors (60FI) that penetrate the resin insulating layer (first resin insulating layer) (50F) are exposed and function as first pads (C4 pads) (73SI). The first pads are formed in the mounting area of the second circuit substrate. An electronic component and the first pads (73SI) are connected via solder bumps (76SI) (see FIG. 2A).

FIG. 1C1 illustrates an enlarged view of a mounting via conductor (60FI) surrounded by a circle (C1) in FIG. 1A. FIG. 1D1 illustrates the mounting via conductor (60FI) before a surface treatment layer (72SI) is formed. As illustrated in FIG. 1D1, the bottom (73SI) of the mounting via conductor (60FI) is recessed by an amount (a1) of (0.1-5 µm) relative to the surface of the resin insulating layer (50F). The mounting via conductor (60FI) is formed from an electroless copper plating film 52 and an electrolytic copper plating film 56. However, as illustrated in FIG. 1D1, when the cavity (mounting area (SMF)) is formed, a portion of the electroless copper plating film 52 of the mounting via conductor (60FI) is etched, and the electrolytic copper plating film 56 is exposed to the bottom (73SI). The surface treatment layer (protective film) (72SI) is formed on the bottom (73SI). The surface treatment layer (72SI) protrudes from the surface of the resin insulating layer (50F) by an amount (b1) of (3-10 µm).

FIG. 1C2 illustrates a portion of the mounting via conductor (60FI) illustrated in FIG. 1C1. The surface treatment layer (72SI) includes three layers including an electroless Ni layer (78a), an electroless Pd layer (78b), and an electroless Au layer (78c). The Ni layer (78a) has a thickness (f1) of 5.0-10.0 µm on the bottom (73SI) of the mounting via conductor (60FI). The Pd layer (78b) has a thickness (f2) of 0.02-0.10 µm on the bottom (73SI). The Au layer (78c) has a thickness (f3) of 0.02-0.10 µm on the bottom (73SI).

FIG. 1D2 illustrates a portion of the mounting via conductor (60FI) illustrated in FIG. 1D1. The openings (70FI) for the via conductors of the resin insulating layer (50F) are each formed in a tapered shape that expands from an opening part (70SI) of the surface of the resin insulating layer (50F) (the third surface (V) of the second circuit substrate) toward the fourth surface (W) of the second circuit substrate. Side walls (73SS) of the mounting via conductors (60FI) are exposed in the openings (70FI) for the via conductors. That is, of a mounting via conductor (60FI), the entire bottom (73SI) and a portion of the side wall (73SS) are exposed. This is because, when the dummy pattern (34FI) is removed by etching, the bottoms (73SI) and the side walls (73SS) of the mounting via conductors (60FI) are also etched. As illustrated in FIG. 1C2, the surface treatment layer (72SI) is formed on the entire bottom (73SI) and a portion of the side wall (73SS) that are exposed. The surface treatment layer (72SI) does not laterally spread beyond the opening part (70SI) of the opening (70FI).

In the present embodiment, it is desirable the recessed amount (a1) of the bottoms (73SI) of the mounting via conductors (60FI) from the resin insulating layer (50F) be 0.1-5 µm. When the recessed amount (a1) is less than 0.1, it is difficult to ensure good insulation performance. The bottoms (73SI) of the mounting via conductors (60FI) that are exposed to the bottom surface (surface (TS)) of the opening (cavity) 26 are recessed relative to the surface of the lowermost resin insulating layer (50F) of the build-up layer (55F). Therefore, insulation performance between the bottoms of the mounting via conductors (60FI) that form the pads for connecting to an electronic component is enhanced, and connection reliability between the pads and the electronic component is improved. On the other hand, when the recessed amount (a1) is more than 5 µm in order to allow the surface treatment layer (72SI) to protrude from the resin insulating layer (50F), the surface treatment layer becomes too thick, and reliability of the surface treatment layer is reduced.

Further, in the printed wiring board of the present embodiment, the surface treatment layer (72SI) that is formed on each of the bottoms (73SI) of the mounting via conductors (60FI) protrudes from the resin insulating layer (50F). Therefore, connection reliability between the bottoms (pads) (73SI) and terminals of an electronic component that are connected to the bottoms is improved. A surface of the surface treatment layer (72SI) that is formed by the noble metal films (the Pd layer (78*b*) and the Au layer (78*c*)) has low toughness and thus, even when the printed wiring board bends during heat cycles, connection reliability of the surface treatment layer (72SI) is unlikely to be reduced.

In the present embodiment, the pads (first pads) (73SI) for mounting an electronic component 90 are the bottoms of the mounting via conductors (60FI). The first pads of the printed wiring board of the present embodiment do not have lands for mounting an electronic component. According to the present embodiment, the pads for mounting an electronic component can have a small size (diameter (dl)). Therefore, the pads can have a narrow pitch (p1). According to the present embodiment, the printed wiring board can be reduced in size. Warpage of the printed wiring board is reduced. Connection reliability between the printed wiring board and an electronic component is improved. A printed wiring board that allows an electronic component to be easily mounted is provided.

In the printed wiring board of the present embodiment, the openings for the via conductors taper from a lower surface of the resin insulating layer toward an upper surface of the resin insulating layer. Therefore, the size of the pads can be further reduced. The pitch of the first pads can be further reduced. The size of the printed wiring board can be reduced. A sophisticated electronic component can be mounted on the printed wiring board.

As illustrated in FIG. 1A, the second resin insulating layer (150F) is formed on the first resin insulating layer (50F) and the conductor layer (58F). Openings (170F) for the second via conductors (160F) that penetrate the second resin insulating layer (150F) are formed in the resin insulating layer (150F).

The second conductor layer (158F) in the second circuit substrate is formed on the second resin insulating layer (150F).

The second via conductors (160F) are formed in the openings (170F) for the second via conductors (160F). The second via conductors (160F) connect the conductor layer (158F) (the second conductor layer in the second circuit substrate) and the conductor layer (58F).

The third resin insulating layer (250F) is formed on the second resin insulating layer (150F) and the second conductor layer (158F). Openings (270F) for the third via conductors (260F) that penetrate the third resin insulating layer (250F) are formed in the resin insulating layer (250F).

The third conductor layer (258F) in the second circuit substrate is formed on the third resin insulating layer (250F).

The third via conductors (260F) are formed in the openings (270F) for the third via conductors. The third via conductors (260F) connect the conductor layer (258F) (the third conductor layer in the second circuit substrate) and the conductor layer (158F). The third conductor layer (258F) is a lowermost conductor layer of the printed wiring board 10.

The printed wiring board can have a resin insulating layer (74F) on the resin insulating layer (lowermost resin insulating layer) (250F) and the conductor layer (lowermost conductor layer) (258F) of the second circuit substrate. Openings (71F) that expose the conductor layer (lowermost conductor layer) (258F) are formed in the resin insulating layer (74F). Portions of the conductor layer (258F) that are exposed by the openings (71F) function as pads (73F) that connect to a motherboard. It is desirable that a material same as that for the resin insulating layers (50F, 150F, 250F) used in the second circuit substrate be used for the resin insulating layer (74F) formed on the lowermost resin insulating layer (250F). The resin insulating layer (74F) may be a solder resist layer.

A surface treatment layer (protective film) (72F) can be formed on each of the pads (73F). The surface treatment layer is a protective film for preventing oxidation of the pad. The protective film is formed, for example, by a Ni/Pd/Au, Ni/Au, Pd/Au or OSP (Organic Solderability Preservative) film.

As illustrated in FIG. 3B, through holes 28 are formed that each include a first opening part (28S) and a second opening part (28F), the first opening part (28S) having a first opening (28SO) on the first surface (S) of the insulating substrate (20*z*), and the second opening part (28F) having a second opening (28FO) on the second surface (F) of the insulating substrate (20*z*). The through holes 28 each have a joining interface. The first opening part and the second opening part are connected by the joining interface (28CF). The joining interface (28CF) is illustrated in FIG. 6B. Oblique lines are drawn in the joining interface (28CF). A place where a side wall of the first opening part and a side wall of the second opening part intersect is a connecting part (28M). It is preferable that the joining interface have a size smaller than that of the first opening. It is preferable that the joining interface have a size smaller than that of the second opening. It is preferable that the first opening part (28S) taper from the first surface toward the second surface. It is preferable that the second opening part (28F) taper from the second surface toward the first surface. The through-hole conductors 36 are formed in the through holes 28 that each have such a shape. The through-hole conductors 36 illustrated in FIG. 1A may be manufactured, for example, using a method described in U.S. Pat. No. 7,786,390. The entire contents of this patent are incorporated herein by reference.

As illustrated in FIG. 1A or FIG. 6A, the opening 26 exposes the mounting area (SMF) of the second circuit substrate. The bottoms of the via conductors (mounting via conductors) (60FI) that penetrate the first resin insulating layer (50F) that is in contact with the first circuit substrate are exposed by the opening 26.

The insulating substrate (20*z*) is formed of a reinforcing member and resin. The insulating substrate (20*z*) may further contain inorganic particles. Examples of the reinforcing member include a glass fiber, a glass cloth and an aramid fiber. Examples of the inorganic particles include silica and alumina particles.

The printed wiring board can have an upper side resin insulating layer (50S) on the first surface (S) and the first conductor layer (34S) of the first circuit substrate 30. Openings (51S) that expose the first conductor layer (34S) are formed in the upper side resin insulating layer (50S) using laser. It is desirable that a material same as that for the resin insulating layers (50F, 150F, 250F) used in the second circuit substrate be used for the upper side resin insulating layer (50S). The upper side resin insulating layer (50S) may be a solder resist layer. Portions of the first conductor layer (34S) that are exposed by the openings (51S) function as pads (second pads) (53S) for mounting a second package substrate 130. A surface treatment layer (protective film) (72S)

can be formed on each of the second pads. The second package substrate 130 is illustrated in FIG. 2B.

The through holes formed in the first circuit substrate of the present embodiment each have the connecting part (28M). The connecting part is a changing point, and thus, the connecting part (28M) is susceptible to a stress. Therefore, in the present embodiment, it is likely that a stress is distributed to contact points (CM) and connecting parts (28M). Thus, a crack hardly occurs from a contact point (CM) to the second circuit substrate. Further, metal is formed at the joining interface (28CF) by a plating film. Metal is more stress resistant than resin. Therefore, even when stress is concentrated on the joining interface (28CF), a crack hardly occurs from the connecting part (28M) or the joining interface (28CF) to the through-hole conductor. The insulating substrate (20z) has a reinforcing member. Therefore, a crack hardly occurs in the first circuit substrate.

When a substrate with a built-in electronic component does not have a connecting part (28M), it is likely that stress concentrates only on a contact point between a corner of the resin layer and a coreless substrate. A crack is likely to enter from the contact point to the coreless substrate.

Figure 2B:
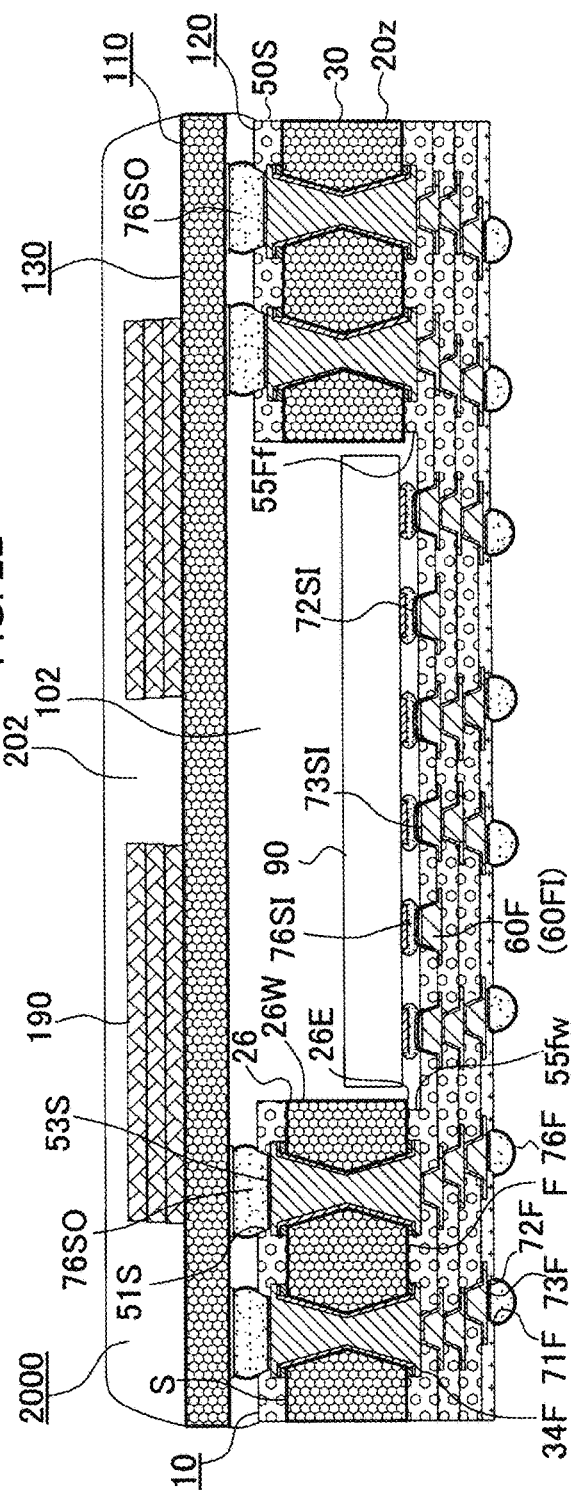

FIG. 2A illustrates a first application example 120 of the printed wiring board 10 of the present embodiment. The first application example 120 is a package substrate (first package substrate).

In the package substrate 120, the electronic component 90 such as an IC chip is accommodated in the opening 26 of the first circuit substrate 30. The electronic component 90 such as an IC chip is mounted by the solder bumps (76SI) on the C4 pads (73SI) that are exposed from the opening 26.

FIG. 2B illustrates a second application example (POP substrate) 2000 of the printed wiring board 10 of the present embodiment. In the second application example, the second package substrate 130 is mounted on the first package substrate 120 via connecting bodies (76SO). The second package substrate 130 includes an upper substrate 110 and an electronic component 190 such as a memory mounted on the upper substrate. The connecting bodies (76SO) are formed on the portions (second pads) (53S) of the second conductor layer that are exposed by the openings (51S) of the upper side resin insulating layer (50S). In FIG. 2B, the connecting bodies (76SO) are solder bumps (76SO). Examples of the connecting bodies other than the solder bumps include metal posts such as plating posts or pins (not illustrated in the drawings). The plating posts or pins each have a shape of a circular cylinder. A right circular cylinder is preferable.

A mold resin 102 is formed between the first package substrate 120 and the second package substrate 130. A mold resin 202 that seals the electronic component 190 is formed on the upper substrate 110.

The first circuit substrate can have resin insulating layers and conductor layers that are alternately laminated on the first surface of the insulating substrate (20z) and on the first conductor layer. In this case, the upper side resin insulating layer (50S) is formed on the resin insulating layers and the conductor layers.

The printed wiring board 10 may have solder bumps (76F) for connecting to a motherboard on the pads (73F) that are exposed from the openings (71F) of the lower side resin insulating layer (74F).

In the printed wiring board of the present embodiment, the opening 26 for accommodating an electronic component is formed in the insulating substrate (20z). Suppose the second circuit substrate is formed on both sides of the first circuit substrate, in this case, a structure symmetrical about the first circuit substrate is obtained. Therefore, a stress acting on a contact point (CM) is small. However, in the printed wiring board of the present embodiment, the second circuit substrate is formed only on the second surface of the first circuit substrate. Therefore, in order to avoid stress concentration, a recess (55Ff) can be formed in the printed wiring board of the present embodiment. The printed wiring board having the recess (55Ff) is illustrated in FIGS. 6D and 5D. The recess (55Ff) is a space formed between the first circuit substrate 30 and the second circuit substrate (55F) and is connected to the opening 26. An upper surface of the recess is the second surface of the first circuit substrate. A lower surface of the recess is the third surface of the second circuit substrate. A side wall (55fw) of the recess is a side surface of the first resin insulating layer (50F) that is in contact with the first circuit substrate. The side wall (55fw) of the recess (55Ff) is recessed from a side wall (26W) of the insulating substrate (20z) that is exposed by the opening 26. Due to the recess (55Ff), a corner part (26E) of the first circuit substrate 30 having a high rigidity is not in contact with the second circuit substrate. Even when a stress due to thermal contraction concentrates on the corner part (26E), the stress does not reach from the corner part to the second circuit substrate. A crack is unlikely to occur in the second circuit substrate. The reliability of the printed wiring board having the recess (55Ff) does not decrease. In the printed wiring board of the present embodiment, the third surface (V) of the second circuit substrate that is exposed from the opening 26 is recessed from the second surface of the first circuit substrate. In this case, a surface (TS) that is exposed from the opening 26 is positioned below the second surface of the first circuit substrate. The lower surface of the recess (55Ff) (the upper surface of the first resin insulating layer (50F) in the recess) connects to the surface (TS) exposed from the opening 26. The lower surface of the recess and the surface (TS) are positioned on the same plane. In the printed wiring board having the recess (55Ff), the upper surface of the first resin insulating layer (50F) is formed by the surface (V) that is in contact with the first circuit substrate, the surface (TS) that is exposed from the opening 26, and the side wall (55fw) that connects the surface (V) and the surface (TS). The surface (V) and the surface (TS) are not positioned on the same plane and thus the side wall (55fw) exists. The side wall (55fw) is a surface that is exposed from the recess (55Ff).

In the printed wiring board of the present embodiment, the resin insulating layer (50S) as an outermost layer on the first surface (S) side of the first circuit substrate 30 is a resin layer that does not contain a core material. Further, the resin insulating layers (50F, 150F, 250F) that form the build-up layer (55F) on the second surface (F) side of the first circuit substrate 30 are also resin layers that do not contain a core material.

The resin insulating layer (74F) on the outermost resin insulating layer (250F) of the build-up layer (55F) may be a solder resist layer. A CET (thermal expansion coefficient) difference between the first surface side and the second surface side can be reduced, and warpage can be suppressed.

Method for Manufacturing Printed Wiring Board

A method for manufacturing the printed wiring board 10 of the present embodiment is illustrated in FIG. 3A-5D.

A starting substrate is prepared. The starting substrate is formed by the insulating substrate (20z) and copper foils (22S, 22F) that are respectively laminated on both sides of the insulating substrate (20z) (FIG. 3A). The insulating substrate includes a reinforcing member, resin and inorganic particles. Examples of the reinforcing member include a glass cloth, a glass fiber and an aramid fiber. Examples of the resin include an epoxy resin and a BT (bismaleimide triazine) resin.

The insulating substrate has the first surface (S) and the second surface (F) that is on an opposite side of the first surface (S). The copper foil (22S) that is laminated on the first surface (S) of the insulating substrate is a first copper foil; and the copper foil (22F) that is laminated on the second surface (F) of the insulating substrate is a second copper foil.

CO2 laser is irradiated to the first copper foil (22S) of the starting substrate. The first opening part (28S) is formed on the first surface (S) side of the insulating substrate (20z). Further, CO2 laser is irradiated to the second copper foil (22F). The second opening part (28F) that connects to the first opening part (28S) is formed on the second surface (F) side. The first opening part (28S) and the second opening part (28F) are connected by the joining interface (28CF). The joining interface (28CF) is illustrated in FIG. 6B. The connecting part (28M) is formed at an intersection point of the side wall of the first opening part and the side wall of the second opening part. Laser is irradiated such that an axis (LL1) of the first opening part and an axis (LL2) of the second opening part coincide. The through holes (28) for the through-hole conductors are formed (FIG. 3B). The first opening part tapers from the first surface (S) toward the second surface (F). The second opening part tapers from the second surface (F) toward the first surface (S). The first opening part has the first opening (28SO) on the first surface; and the second opening part has the second opening (28FO) on the second surface.

An electroless plating film is formed on the first copper foil, the second copper foil, and side walls of the through holes 28. A plating resist film is formed on the electroless plating film. Thereafter, the through-hole conductors 36 in the through holes 28 and a pattern are formed by electrolytic plating. The plating resist film is peeled off. The electroless plating film and the copper foils (22F, 22S) below the plating resist film are removed using an etching solution. As a result, the first conductor layer (34S) is formed on the first surface of the insulating substrate. The second conductor layer (34F) is formed on the second surface of the insulating substrate. The second conductor layer (34F) includes a dummy pattern (34FI) for forming the opening 26. The through-hole conductors 36 that connect the first conductor layer and the second conductor layer are formed in the through holes 28. Each of the through-hole conductors has a thinnest portion at the connecting part (28M) of the through hole. An intermediate substrate 300 is obtained that includes the insulating substrate that has the through holes 28, the through-hole conductors 36 that are formed in the through holes 28, the first conductor layer (34S) that is formed on the first surface of the insulating substrate, and the second conductor layer (34F) that is formed on the second surface insulating substrate (FIG. 3C). The intermediate substrate 300 may also be manufactured using a method described in U.S. Pat. No. 7,786,390. The intermediate substrate has a first surface and a second surface. The first surface of the intermediate substrate and the first surface of the insulating substrate are the same surface; and the second surface of the intermediate substrate and the second surface of the insulating substrate are the same surface.

Figure 7A:
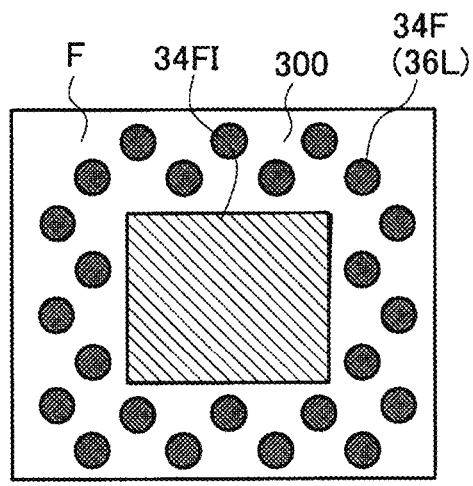
FIG. 7A is a plan view of an intermediate substrate.
Figure 7B:
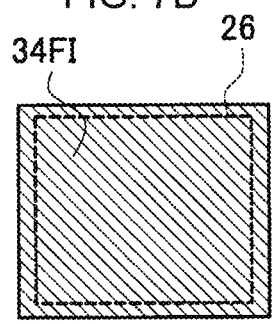
FIG. 7B illustrates a dummy pattern.

FIG. 7A illustrates a plan view of the intermediate substrate 300. FIG. 7A is a plan view obtained by observing the intermediate substrate from the second conductor layer side. FIG. 7A illustrates the second conductor layer and the second surface (F) of the insulating substrate (20z) that is exposed from the second conductor layer. The dummy pattern (34FI) is formed substantially at a center of the second surface of the insulating substrate. Oblique lines are drawn in the dummy pattern (34FI). The dummy pattern (34FI) covers a predetermined region of the second surface of the insulating substrate (20z). The dummy pattern (34FI) is a so-called solid pattern. The lands (36L) of the through-hole conductors 36 are illustrated around the dummy pattern. Crossing oblique lines are drawn in the lands (36L). FIG. 7B illustrates a positional relation between the opening 26 and the dummy pattern (34FI) and sizes of the two. An outer periphery of the dummy pattern (34FI) is indicated using a solid line; and an outer periphery of the opening 26 is indicated using a dotted line. The dotted line indicates the outer periphery of the opening 26 that is formed on the dummy pattern. As illustrated in FIG. 7B, the dummy pattern (34FI) is larger than the opening 26. Further, the outer periphery of the dummy pattern (34FI) is positioned outside the outer periphery of the opening 26.

The upper side resin insulating layer (50S) is formed on the first surface (S) of the intermediate substrate 300 by hot pressing. The resin insulating layer (first resin insulating layer) (50F) is formed on the second surface (F) of the intermediate substrate, and a second intermediate body 400 is completed (FIG. 3D). The upper side resin insulating layer (50S) and the first resin insulating layer (50F) are of thermosetting type. The resin insulating layers (50F, 50S) contain a resin such as an epoxy resin, and inorganic particles such as silica particles. The resin insulating layers (50F, 50S) contain 40-80 wt % of an inorganic filler and are adjusted to have a thermal expansion coefficient of 25-40 ppm. The same also applies to the resin insulating layers (150F, 250F). The resin insulating layer (50F) and the resin insulating layer (50S) may further contain a reinforcing member such as a glass cloth. It is desirable that the resin insulating layer (50F) and the resin insulating layer (50S) have the same composition.

The second intermediate body 400 is affixed to both sides of a support film 80 (FIG. 3E). A material of the support film 80 is not particularly limited. For example, a PET material or the like can be used.

Figure 4A:
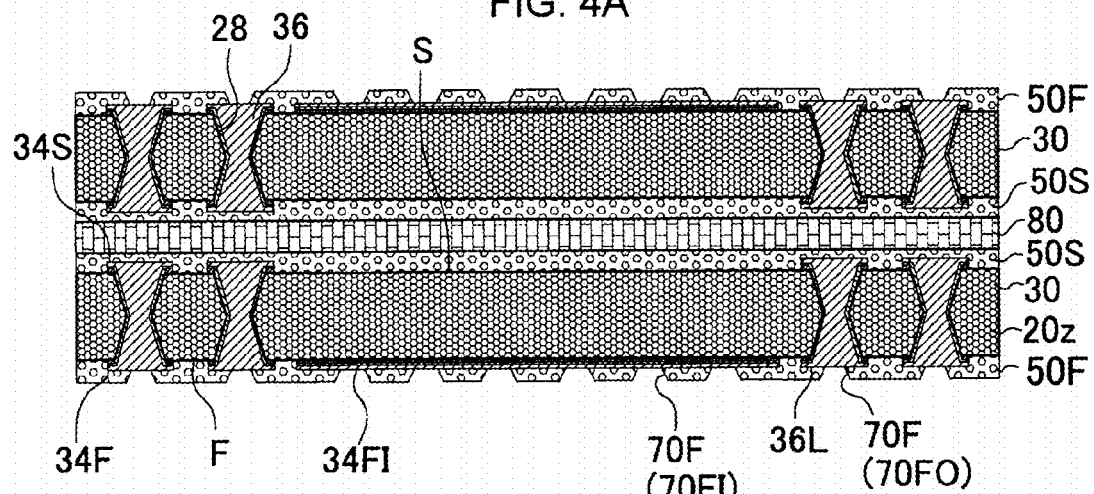
FIG. 4A-4C are process diagrams illustrating the method for manufacturing the printed wiring board of the embodiment.
Figure 4B:
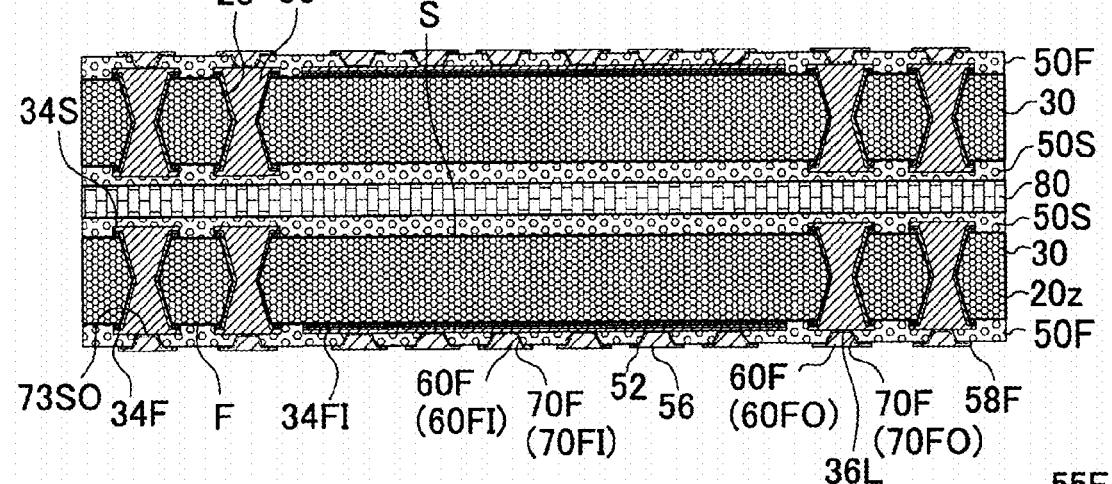

Next, the openings (70F) (70FI, 70FO) for the via conductors that reach the second conductor layer (34F) are formed in the first resin insulating layer (50F) (FIG. 4A). The openings (70F) for the via conductors include the openings (70FI) that reach the dummy pattern (34FI) and the openings (70FO) that reach the second conductor layer other than the dummy pattern. The openings (70FI) are the openings for forming the mounting via conductors. The openings (70FO) are the openings for forming the connection via conductors. The openings (70FO), for example, reach the lands (36L) of the through-hole conductors. A land of a through-hole conductor is formed by a conductor that is formed directly on the through-hole conductor and a conductor that is formed around the through-hole conductor. The conductor layer (58F) is formed on the first resin insulating layer (50F) using a semi-additive method. At the same time, the via conductors (60F) are formed in the openings (70F) (FIG. 4B). The via conductors (connection via conductors) (60FO) that connect to the through-hole conductors are formed in the openings (70FO). The via conductors (mounting via conductors) (60FI) that form the C4 pads are formed in the openings (70FI). The via conductors (60F) have the bottoms. The bottoms of the connection via conductors are in contact with the lands (36L) of the through-hole conductors.

The bottoms of the mounting via conductors are formed on the dummy pattern (34FI). The bottoms of the mounting via conductors are in contact with the dummy pattern.

A metal film can be formed on each of portions of the dummy pattern that are exposed from the openings (70FI). The metal films function as the C4 pads. The metal films are formed of a metal other than copper, and prevent oxidation of the C4 pads (first pads). Examples of the metal of the metal films include gold, palladium, and tin. Nickel can be formed between a metal film and a C4 pad.

The second resin insulating layer (150F) is formed on the first resin insulating layer (50F) and the conductor layer (58F) by hot pressing. The openings (170F) for the second via conductors are formed in the second resin insulating layer (150F). The second resin insulating layer (150F) is of a thermosetting type.

The conductor layer (158F) is formed on the second resin insulating layer (150F). At the same time, the second via conductors (160F) are formed in the openings for the second via conductors. The conductor layer (158F) and the via conductors (160F) are formed using a semi-additive method.

The third resin insulating layer (250F), the conductor layer (258F) and the third via conductors (260F) are formed using the same method as described in the previous paragraph.

The third resin insulating layer (250F) is of a thermosetting type. The resin insulating layers (50F, 150F, 250F) included in the second circuit substrate are of thermosetting type.

Figure 4C:
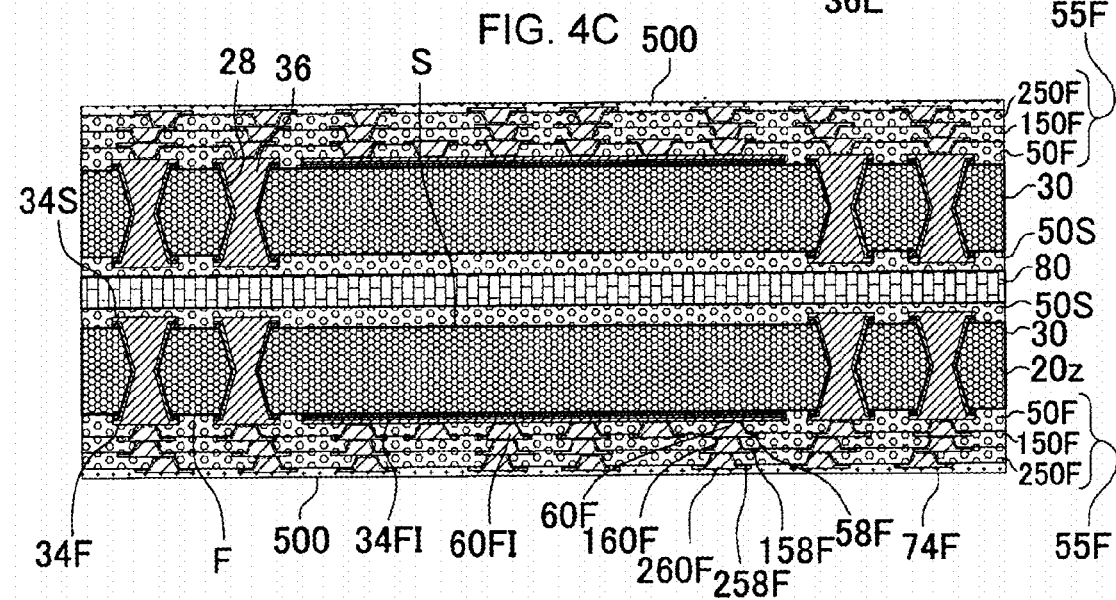

The lower side resin insulating layer (74F) is formed on the third resin insulating layer (250F) and the conductor layer (258F) (FIG. 4C). The lower side resin insulating layer (74F) is of a thermosetting type. The lower side resin insulating layer (74F) contains resin and inorganic particles. The lower side resin insulating layer (74F) does not contain a reinforcing member such as a glass cloth.

The upper side resin insulating layer (50S) is of a thermosetting type of the same material as the first resin insulating layer (50F), the second resin insulating layer (150F) and the third resin insulating layer (250F) of the build-up layer and the resin insulating layer (74F) on the build-up layer. The resin insulating layer (74F) on the build-up layer may be a solder resist layer. In this case, the openings are formed by exposure and development processing.

Figure 5A:
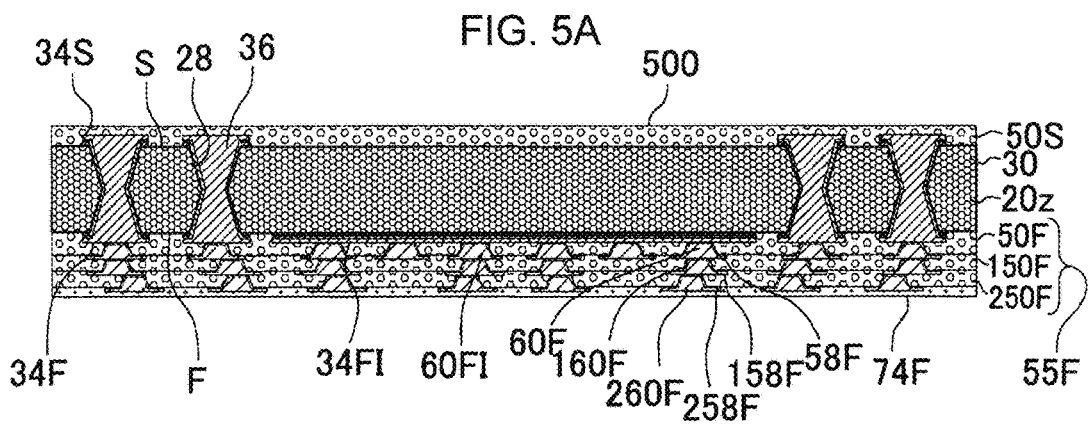
FIG. 5A-5D are process diagrams illustrating the method for manufacturing the printed wiring board of the embodiment.

The laminated bodies on both sides of the support film 80 are peeled off from the support film 80, and each become a third intermediate body 500 (FIG. 5A).

Figure 7C:
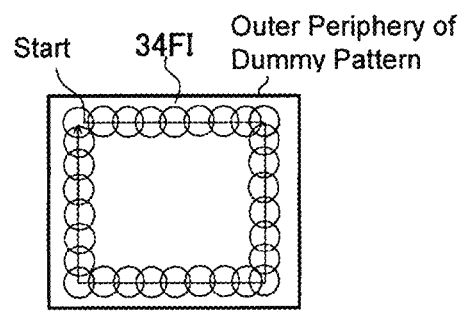
FIGS. 7C and 7D illustrate a method for forming an opening.
Figure 7D:
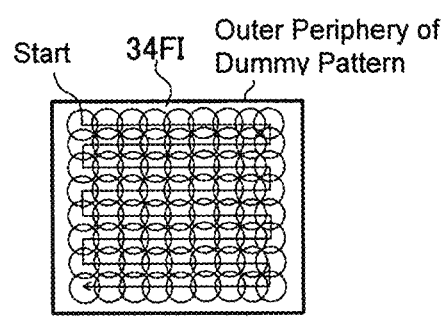

FIGS. 7C and 7D are plan views, in which the second surface of the insulating substrate is projected at the same magnification on the dummy pattern.

Figure 5B:
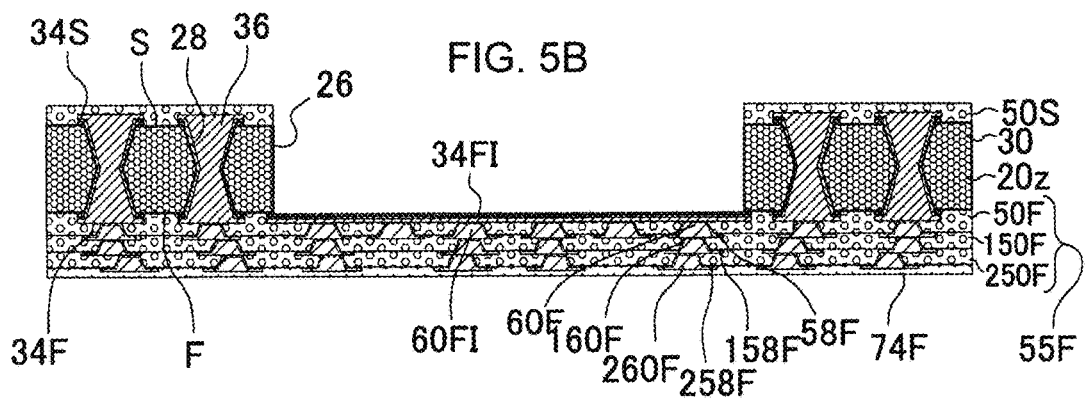
Figure 5C:
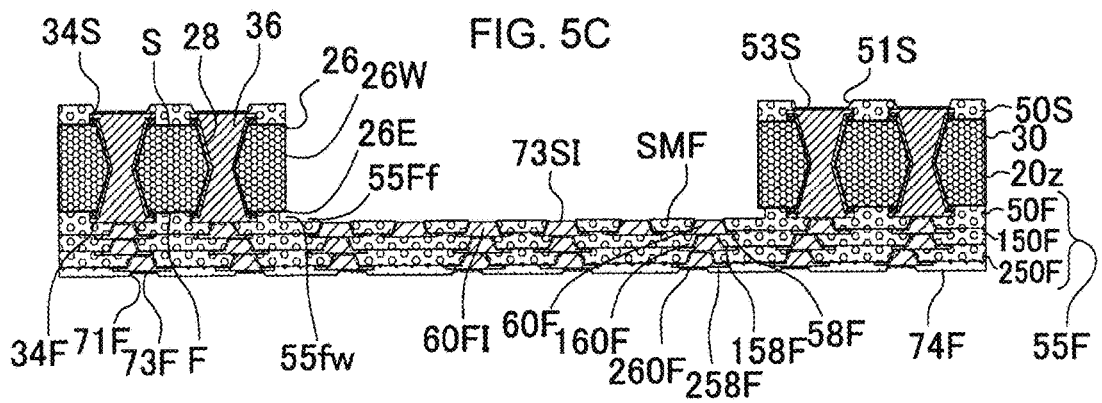
Figure 5D:
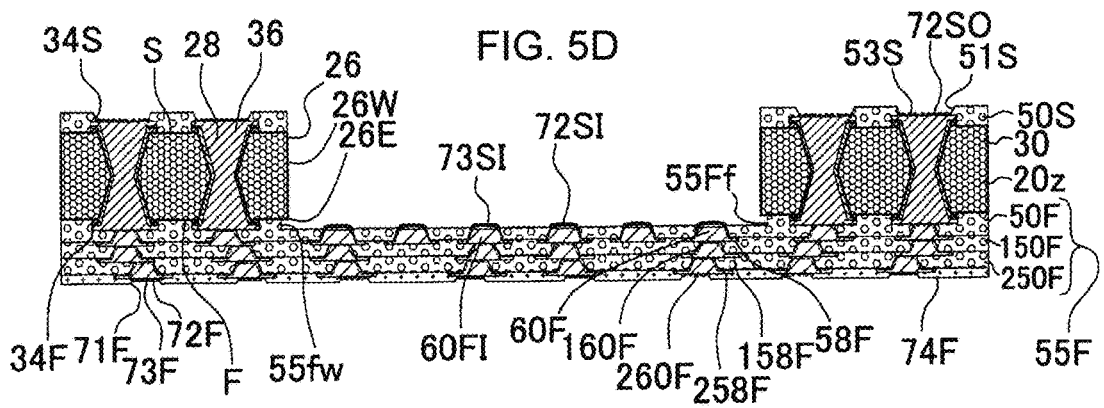

FIG. 7D illustrates an example of a method for forming the opening 26. Laser is irradiated to the second surface of the insulating substrate via the upper side resin insulating layer (50S). Initially, laser is irradiated to a start position in FIG. 7D. Laser penetrates the insulating substrate and reaches the dummy pattern. Thereafter, the laser irradiation position is sequentially moved along an arrow illustrated in FIG. 7D such that adjacent through holes overlap each other. The insulating substrate on the dummy pattern is removed. The opening 26 that exposes the dummy pattern is formed (FIG. 5B). In the method of FIG. 7D, the opening 26 is formed by through holes. By increasing overlapping portions, the outer periphery of the opening 26 is substantially straight. The dummy pattern that is exposed from the opening 26 is removed by etching. The bottoms (73SI) of the via conductors (60FI) that form the C4 pads are exposed by the opening 26 (FIG. 5C). As illustrated in FIG. 1D1, etching is adjusted such that the bottoms (73SI) of the via conductors (60FI) are recessed by the amount (a1) of (0.1-5 μm) relative to the surface of the resin insulating layer (50F).

In the present embodiment, the size of the dummy pattern is larger than the side of the opening 26. The dummy pattern between the first circuit substrate and the second circuit substrate is removed. Therefore, as illustrated in FIG. 5C, the mounting area is recessed from the second surface of the first circuit substrate. Further, a space (recess) (55Ff) is formed between the first circuit substrate and the second circuit substrate.

FIG. 7C illustrates another example of the method for forming the opening. In FIG. 7C, a frame-shaped opening that reaches the dummy pattern is formed using laser. An etching solution is introduced into the frame-shaped opening. The dummy pattern is dissolved. In this case, the dummy pattern sandwiched by the insulating substrate and the second circuit substrate is dissolved. As a result, the insulating substrate on a inner side of the opening is peeled off from the second circuit substrate. The insulating substrate on the inner side of the opening can be removed from the second circuit substrate. The opening 26 that exposes the bottoms of the via conductors (60FI) that form the C4 pads is formed (FIG. 5B).

By irradiating laser to a film such as a PET film laminated on the resin insulating layer (50S), the opening 26 that penetrates the film 80, the resin insulating layer (50S) and the first circuit substrate is formed. After the opening 26 is formed, the film 80 is removed.

The opening 26 may also be formed using a router.

In the case where the opening 26 is formed using the method illustrated in FIG. 7D, the dummy pattern that is formed of copper is removed by etching. For example, when the bottoms of the mounting via conductors are each formed of a metal film of gold, palladium, tin, and the like, when the dummy pattern is removed by etching, dissolution of the bottoms of the mounting via conductors is suppressed.

The openings (51S) that expose the pads (53S) are formed in the upper side resin insulating layer (50S) using laser.

The openings (71F) that expose the pads (73F) are formed in the lower side resin insulating layer (74F) using laser. The lower side resin insulating layer (74F) may be a solder resist layer. In this case, the openings (71F) that expose the pads (73F) are formed by exposure processing and development processing.

The Ni layer (78a) is formed on each of the pads (73F, 53S) and the C4 pads (73SI) by electroless Ni plating The Pd layer (78b) is formed on the Ni layer (78a) by electroless Pb plating. The Au layer (78c) is formed on the Pd layer (78b) by electroless Au plating. The surface treatment layers (protective films) (72F, 72SO, 72SI) that each include three layers including the Ni layer (78a), the Pd layer (78b) and the Au layer (78c) are formed (FIGS. 5D and 1C1). The surface treatment layers are protective films for preventing oxidation of the pads. Of each of the protective films, as illustrated in FIG. 1C1, the Ni layer (78a) is formed to have the thickness (f1) of 5.0-10.0 μm; the Pd layer (78b) is formed to have the thickness (f2) of 0.02-0.10 μm; and the Au layer (78c) is formed to have the thickness (f3) of 0.02-0.10 μm. The surface treatment layer (72SI) is formed to protrude from the surface of the resin insulating layer (50F) by the amount (b1) of (3-10 μm).

Here, a protective film can be formed using an OSP (Organic Solderability Preservative) film on each of the pads (73F) and pads (53S).

The solder bumps (76F, 76SI, 76SO) can be formed on the pads (73F, 73SI, 53S).

The resin insulating layers (50F, 150F, 250F) each have an upper surface and a lower surface that is on an opposite side of the upper surface. The upper surface of each of the resin insulating layers is a surface close to the first circuit substrate 30; and the lower surface of each of the resin insulating layers is a surface close to the lower side resin insulating layer (74F). The openings (70F, 170F, 270F) for the via conductors that are respectively formed in the resin insulating layers each taper from the lower surface toward the upper surface. The side walls of the via conductors (60F, 160F, 260F) that are respectively formed in the openings for the via conductors also each taper from the lower surface toward the upper surface.

The conductor layers (58F, 158F, 258F) and the via conductors (60F, 160F, 260F) are each formed by an electroless copper plating film 52 and an electrolytic copper plating film 56 on the electroless copper plating film (see FIG. 4B).

The electronic component 90 is mounted on the printed wiring board via the solder bumps (76SI) on the C4 pads (73SI). The first package substrate (first application example) is completed (FIG. 2A). The IC chip is accommodated in the opening. The IC chip does not extends to the outside of the opening 26. The second package substrate 130 is mounted on the first package substrate 120 via the solder bumps (76SO) (FIG. 2B). The POP substrate (second application example) 2000 is completed.

The mounting via conductors that are each formed by a seed layer (electroless copper plating film) 52 and an electrolytic copper plating film 56 are formed on the dummy pattern that is exposed from the openings (70FI). A metal film can be formed between the dummy pattern and the seed layer. By removing only the dummy pattern, the bottoms of the mounting via conductors (60FI) are exposed. The bottoms of the mounting via conductors that are each formed by the seed layer and the third surface of the first resin insulating layer (50F) are positioned on the same plane. The bottoms of the mounting via conductors that are each formed by the metal film and the third surface of the first resin insulating layer (50F) are positioned on the same plane.

First Modified Example of Embodiment

FIG. 6A illustrates a first modified example of the present embodiment. In the printed wiring board of the first modified example, the opening 26 tapers from first surface (S) toward the second surface (F). The side wall (26W) of the first circuit substrate that is exposed from the opening 26 tapers from the first surface (S) toward the second surface (F). In contrast, the openings for the via conductors that are formed in the second circuit substrate each taper from the fourth surface (W) side toward the third surface (V) side. The openings for the via conductors that are respectively formed in the resin insulating layers each taper from the lower surface toward the upper surface. The openings that are formed in the second circuit substrate and the opening that is formed in the first circuit substrate taper in opposite directions. Since the openings in the second circuit substrate and the opening in the first circuit substrate are oppositely oriented, warpages are offset. Warpage of the printed wiring board that is formed by the first circuit substrate and the second circuit substrate is reduced.

Figure 8B:
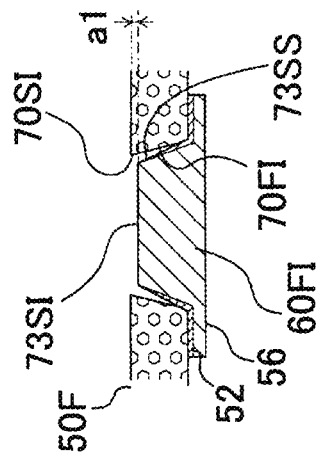
FIGS. 8A and 8B are cross-sectional views illustrating a mounting via conductor according to a first modified example of the embodiment.
Figure 8A:
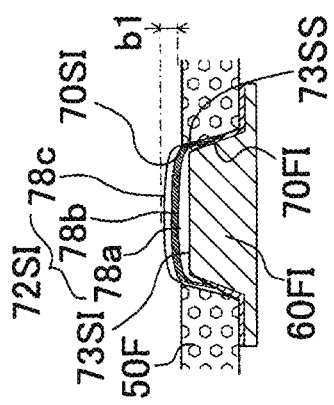

FIGS. 8A and 8B illustrate cross sections of the mounting via conductor (60FI) according to the first modified example of the present embodiment. The mounting via conductor (60FI) is formed from the electroless copper plating film 52 and the electrolytic copper plating film 56. The electrolytic copper plating film 56 is exposed to the bottom (73SI). The bottom (73SI) of the mounting via conductor (60FI) is recessed by the amount (a1) of (0.1-5 μm) relative to the surface of the resin insulating layer (50F). The surface treatment layer (protective film) (72SI) is formed on the bottom (73SI). The surface treatment layer (72SI) protrudes from the surface of the resin insulating layer (50F) by the amount (b1) of (3-10 μm).

Second Modified Example of Embodiment

Figure 7E:
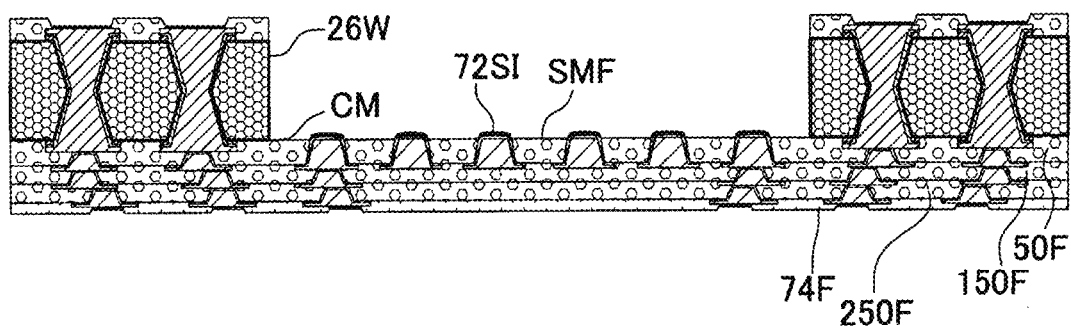
FIG. 7E illustrates a cross-section of a printed wiring board of a second modified example of the embodiment.

FIG. 7E illustrates a second modified example of the present embodiment.

In FIG. 5B, when the outer periphery of the dummy pattern and the outer periphery of the opening 26 coincide with each other, the second modified example of the printed wiring board that does not have the recess (55Ff) is obtained. In the printed wiring board of the second modified example, the contact point (CM) and the side wall (26W) of the first circuit substrate are positioned substantially on a straight line. The contact point (CM) between the first circuit substrate 30 and the second circuit substrate (55F), and the first circuit substrate and the second circuit substrate near the contact point (CM), are illustrated in FIG. 6C.

The insulating substrate (20z) of the first circuit substrate 30 has a reinforcing member. Therefore, the first circuit substrate has a high strength and a high rigidity. Warpage of the printed wiring board according to the second modified example of the present embodiment is small. According to the second modified example of the present embodiment, warpage due to heat cycles is small. Therefore, s stress acting on the contact point (CM) between the corner part (26E) of the first circuit substrate and the second circuit substrate is small. A crack starting from the contact point is unlikely to occur in the second circuit substrate. The contact point (CM) and the corner part (26E) are illustrated in FIG. 6C.

Figure 8C:
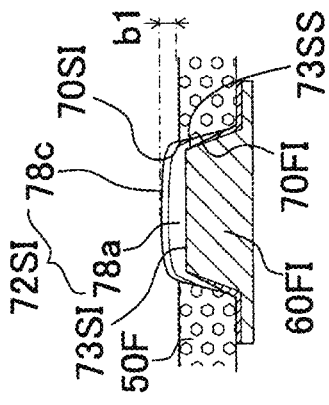
FIG. 8C is cross-sectional view illustrating a mounting via conductor according to a second modified example of the embodiment.

FIG. 8C illustrates a cross section of the mounting via conductor (60FI) according to the second modified example of the present embodiment. The surface treatment layer (protective film) (72SI) that is formed on the bottom (73SI) of the mounting via conductor (60FI) is formed from two layers including the Ni layer (78a) and the Au layer (78c).

Figure 8D:
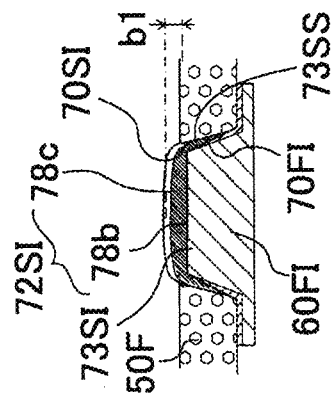
FIG. 8D is cross-sectional view illustrating a mounting via conductor according to a third modified example of the embodiment.

FIG. 8D illustrates a cross section of the mounting via conductor (60FI) according to a third modified example of the present embodiment. The surface treatment layer (protective film) (72SI) that is formed on the bottom (73SI) of the mounting via conductor (60FI) is formed from two layers including the Pd layer (78b) and the Au layer (78c).

When a substrate with a built-in electronic component is formed by a coreless substrate and a resin layer that has the accommodating part for accommodating a semiconductor chip, and pads that are each formed of a conductor layer are provided on a bottom surface of the recessed accommodating part, insulation performance between the pads is likely to deteriorate, and reliability of connection to an electronic component is likely to deteriorate.

A printed wiring board according to an embodiment of the present invention has connection reliability and has a cavity for accommodating an electronic component.

A printed wiring board according to an embodiment of the present invention includes: a substrate that has a first surface and a second surface that is on an opposite side of the first surface; a first conductor layer that is formed on the first surface of the substrate; a second conductor layer that is formed on the second surface of the substrate; a through-hole conductor that penetrates the substrate and connects the first conductor layer and the second conductor layer; a build-up layer that is formed on the second surface side of the substrate by alternately laminating conductor layers and insulating layers and in which upper and lower conductor layers are connected by a via conductor; a first insulating layer that is formed on the first surface side of the substrate; and a cavity that penetrates the first insulating layer and the substrate to expose the build-up layer that is laminated on the second surface of the substrate. A bottom part of a via conductor that is exposed to a bottom surface of the cavity is recessed relative to a surface of a lowermost insulating layer of the build-up layer.

In a printed wiring board according to an embodiment of the present invention, a bottom part of a via conductor that is exposed to the bottom surface of the cavity is recessed relative to the surface of a lowermost insulating layer of the build-up layer. Therefore, insulation performance between bottom parts of via conductors that form pads for connecting to an electronic component is enhanced, and connection reliability between the pads and the electronic component is improved.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
a substrate;
a first conductor layer formed on a first surface of the substrate;
a second conductor layer formed on a second surface of the substrate;
a through-hole conductor penetrating through the substrate such that the through-hole conductor is connecting the first conductor layer and the second conductor layer;
a build-up layer formed on the second surface of the substrate and comprising a plurality of conductor layers, a plurality of insulating layers, and a plurality of via conductors connecting the conductor layers through the insulating layers; and
a first insulating layer formed on the first surface the substrate such that the first insulating layer is covering the first conductor layer on the substrate,
wherein the substrate has a cavity penetrating through the first insulating layer and the substrate such that the cavity is exposing a mounting area portion of the build-up layer on the second surface of the substrate, the build-up layer is formed such that the plurality of via conductors includes a plurality of mounting via conductors positioned in the mounting area portion and having a plurality of bottom portions exposed in the cavity, and the plurality of mounting via conductor is formed such that each of the bottom portions of the mounting via conductors is recessed relative to a surface of a lowermost insulating layer in the build-up layer at a bottom of the cavity.

2. A printed wiring board according to claim 1, wherein the plurality of mounting via conductors is formed such that each of the bottom portions is recessed in a range of 0.1 μm to 5 μm relative to the surface of the lowermost insulating layer in the build-up layer at the bottom of the cavity.

3. A printed wiring board according to claim 2, wherein the plurality of insulating layers in the build-up layer does not include core material and includes inorganic filler in an amount of 40 wt % to 80 wt %.

4. A printed wiring board according to claim 2, wherein the through-hole conductor is formed such that the through-hole conductor comprises a taper portion tapering from the first surface toward the second surface of the substrate and a taper portion tapering from the second surface toward the first surface of the substrate.

5. A printed wiring board according to claim 2, wherein the substrate has the cavity formed such that the cavity is tapering from the first surface toward the second surface of the substrate.

6. A printed wiring board according to claim 1, further comprising:
a plurality of surface treatment layer portions formed on the bottom portions of the mounting via conductors, respectively,
wherein each of the surface treatment layer portions comprises one of a structure comprising a Ni layer, a Pd layer and a Au layer, a structure comprising a Ni layer and a Au layer, and a structure comprising a Pd layer and a Au layer.

7. A printed wiring board according to claim 6, wherein the plurality of surface treatment layer portions is formed on the bottom portions of the mounting via conductors such that the plurality of surface treatment layer portions is projecting in a range of 3 μm to 10 μm relative to the surface of the lowermost insulating layer in the build-up layer at the bottom of the cavity.

8. A printed wiring board according to claim 6, wherein the plurality of surface treatment layer portions is formed on the bottom portions of the mounting via conductors such that the plurality of surface treatment layer portions is covering the bottom portions and portions of side surfaces of the mounting via conductors.

9. A printed wiring board according to claim 1, further comprising:
a plurality of surface treatment layer portions formed on the bottom portions of the mounting via conductors, respectively,
wherein each of the surface treatment layer portions comprises a structure comprising a Ni layer, a Pd layer and a Au layer such that the Ni layer has a thickness in a range of 5.0 μm to 10.0 μm, the Pd layer has a thickness in a range of 0.02 μm to 0.10 μm and the Au layer has a thickness in a range of 0.02 μm to 0.10 μm.

10. A printed wiring board according to claim 1, wherein the plurality of insulating layers in the build-up layer does not include core material and includes inorganic filler in an amount of 40 wt % to 80 wt %.

11. A printed wiring board according to claim 1, wherein the through-hole conductor is formed such that the through-hole conductor comprises a taper portion tapering from the first surface toward the second surface of the substrate and a taper portion tapering from the second surface toward the first surface of the substrate.

12. A printed wiring board according to claim 1, wherein the plurality of via conductors in the build-up layer includes a plurality of via conductors forming a stack via conductor structure.

13. A printed wiring board according to claim 1, wherein the substrate has the cavity formed such that the cavity is tapering from the first surface toward the second surface of the substrate.

14. A printed wiring board according to claim 1, further comprising:
a plurality of surface treatment layer portions formed on the bottom portions of the mounting via conductors, respectively.

15. A printed wiring board according to claim 14, wherein the plurality of surface treatment layer portions is formed on the bottom portions of the mounting via conductors such that each of the surface treatment layer portions is projecting in a range of 3 μm to 10 μm relative to the surface of the lowermost insulating layer in the build-up layer at the bottom of the cavity.

16. A printed wiring board according to claim 14, wherein the plurality of surface treatment layer portions is formed on the bottom portions of the mounting via conductors such that the plurality of surface treatment layer portions is covering the bottom portions and portions of side surfaces of the mounting via conductors.

17. A printed wiring board according to claim 1, further comprising:
a plurality of surface treatment layer portions formed on the bottom portions of the mounting via conductors, respectively,
wherein each of the surface treatment layer portions is one of a structure consisting of a Ni layer, a Pd layer and a Au layer, a structure consisting of a Ni layer and a Au layer, and a structure consisting of a Pd layer and a Au layer.

18. A printed wiring board according to claim 17, wherein the plurality of surface treatment layer portions is formed on the bottom portions of the mounting via conductors such that each of the surface treatment layer portions is projecting in a range of 3 μm to 10 μm relative to the surface of the lowermost insulating layer in the build-up layer at the bottom of the cavity.

19. A printed wiring board according to claim 17, wherein the plurality of surface treatment layer portions is formed on the bottom portions of the mounting via conductors such that the plurality of surface treatment layer portions is covering the bottom portions and portions of side surfaces of the mounting via conductors.

20. A printed wiring board according to claim 1 wherein each of the mounting via conductors in the build-up layer comprises an electroless plating portion and an electrolytic plating portion such that each of the bottom portions a surface of the electrolytic plating portion exposed from the electroless plating portion.

* * * * *